(12) United States Patent
Subramanyam

(10) Patent No.: US 9,000,866 B2
(45) Date of Patent: Apr. 7, 2015

(54) VARACTOR SHUNT SWITCHES WITH PARALLEL CAPACITOR ARCHITECTURE

(75) Inventor: Guru Subramanyam, Dayton, OH (US)

(73) Assignee: University of Dayton, Dayton, OH (US)

( * ) Notice: Subject to any disclaimer, the term of this patent is extended or adjusted under 35 U.S.C. 154(b) by 477 days.

(21) Appl. No.: 13/533,310

(22) Filed: Jun. 26, 2012

(65) Prior Publication Data

US 2013/0342289 A1     Dec. 26, 2013

(51) Int. Cl.
| | |
|---|---|
| *H01L 29/93* | (2006.01) |
| *H01L 27/08* | (2006.01) |
| *H01P 1/15* | (2006.01) |
| *H01P 9/00* | (2006.01) |
| *H01P 3/00* | (2006.01) |

(52) U.S. Cl.
CPC .............. *H01P 1/15* (2013.01); *H01L 27/0808* (2013.01); *H01P 3/003* (2013.01)

(58) Field of Classification Search
CPC .............. H01P 1/10; H01P 9/00; H01L 29/93
USPC ............... 333/101, 103, 104, 108, 157, 24 C; 257/595, 601
See application file for complete search history.

(56) References Cited

U.S. PATENT DOCUMENTS

| | | | |
|---|---|---|---|
| 3,413,543 A | 11/1968 | Schubring et al. | |
| 4,835,499 A | 5/1989 | Pickett | |
| 5,029,583 A | 7/1991 | Meserol et al. | |
| 5,227,748 A | 7/1993 | Sroka | |
| 5,496,795 A | 3/1996 | Das | |
| 5,640,042 A | 6/1997 | Koscica et al. | |
| 5,689,275 A | 11/1997 | Moore et al. | |
| 5,694,134 A | 12/1997 | Barnes | |

(Continued)

FOREIGN PATENT DOCUMENTS

| | | |
|---|---|---|
| EP | 0608889 A1 | 8/1994 |
| EP | 0843374 A2 | 5/1998 |

(Continued)

OTHER PUBLICATIONS

D. Kuylenstierna, et al., "40 GHz Lumped Element Tunable Bandpass Filters With Transmission Zeros Based on Thin Ba<0.25>Sr<0.75>TiO<3> (BST) Film Varactors", 2006 Topical Meeting on Silicon Monolithic Integrated Circuits in RF Systems (IEEE Cat. No> 06EX1204) IEEE Piscataway, NJ Jan. 18, 2006-Jan. 20, 2006, pp. 342-345.

(Continued)

*Primary Examiner* — Dean Takaoka
(74) *Attorney, Agent, or Firm* — Dinsmore & Shohl LLP

(57) ABSTRACT

A parallel capacitor varactor shunt switch device may include a shunt layer, a coplanar waveguide (CPW) layer, and a tunable thin film dielectric layer that is interposed between the shunt layer and the CPW layer. The tunable thin film dielectric layer electrically isolates the shunt layer from the CPW layer. The shunt layer includes a plurality of parallel shunt lines. The CPW layer includes a CPW signal transmission line with two CPW ground lines parallel to the CPW signal transmission line. A plurality of varactor areas equal in number to the plurality of parallel shunt lines are defined in the CPW signal transmission line, each varactor area corresponding to an overlap of the CPW signal transmission line with a respective shunt line and each respective parallel shunt line and its corresponding varactor area defines a capacitor.

13 Claims, 7 Drawing Sheets

(56) References Cited

U.S. PATENT DOCUMENTS

| | | |
|---|---|---|
| 5,721,194 A | 2/1998 | Yandrofski et al. |
| 6,084,503 A | 7/2000 | Ruile et al. |
| 6,377,440 B1 | 4/2002 | Zhu et al. |
| 6,404,614 B1 | 6/2002 | Zhu et al. |
| 6,433,375 B1 | 8/2002 | Carlsson et al. |
| 6,454,914 B1 | 9/2002 | Nakamura |
| 6,525,630 B1 | 2/2003 | Zhu et al. |
| 6,727,535 B1 | 4/2004 | Sengupta et al. |
| 6,740,922 B2 | 5/2004 | Jones et al. |
| 7,109,818 B2 * | 9/2006 | Rivkina et al. ............... 333/24 C |
| 7,154,357 B2 | 12/2006 | Kozyrev et al. |
| 7,692,270 B2 | 4/2010 | Subramanyam et al. |
| 7,719,392 B2 | 5/2010 | Subramanyam et al. |
| 2002/0047113 A1 | 4/2002 | Ohno et al. |
| 2002/0053676 A1 | 5/2002 | Kozaki |
| 2002/0158717 A1 | 10/2002 | Toncich |
| 2002/0163400 A1 | 11/2002 | Toncich |
| 2002/0163408 A1 | 11/2002 | Fujii et al. |
| 2002/0186099 A1 | 12/2002 | Sengupta et al. |
| 2003/0001692 A1 | 1/2003 | Chiu et al. |
| 2003/0020567 A1 | 1/2003 | Chappell et al. |
| 2006/0152303 A1 | 7/2006 | Liang et al. |
| 2007/0069264 A1 | 3/2007 | Subramanyam et al. |
| 2007/0082803 A1 | 4/2007 | Cansell et al. |
| 2007/0100256 A1 | 5/2007 | Sansom |
| 2007/0152773 A1 | 7/2007 | Oakes et al. |
| 2009/0270765 A1 | 10/2009 | Ghesquiere et al. |
| 2010/0096678 A1 | 4/2010 | Subramanyam |
| 2010/0312266 A1 | 12/2010 | Fukuzawa |

FOREIGN PATENT DOCUMENTS

| | | |
|---|---|---|
| JP | 2001338839 A | 12/2001 |
| WO | 9413028 | 6/1994 |
| WO | 0115260 A1 | 3/2001 |
| WO | 02084310 A1 | 10/2002 |
| WO | 02084685 A1 | 10/2002 |
| WO | 2005043669 A1 | 5/2005 |
| WO | 2008043001 A2 | 4/2008 |
| WO | 2011044971 A2 | 4/2011 |

OTHER PUBLICATIONS

Subramanyam, et al., "Novel Multi-Capacitor Architecture for BST Thin Film Varactors", integrated Ferroelectrics, 125:11-19, 2011, Taylor & Francis Group, LLC, ISSN: 1058-4587 print / 1607-8489 online; DOI: 10.1080/10584587.2011.573995, pp. [189]/11-[197]/19.

Muldavin, et al., "High Isolation CPW MEMS Shunt Switches Part 1: Modeling", IEEE Transactions on Microwave Theory and Techniques, Dec. 1999, pp. 1-12.

Rebiez, et al., "RF MEMS Switches and Switch Circuits", IEEE Microwave Magazine, Dec. 2001, pp. 59-71.

Kuylenstierna, et al., "Tunable Electromagnetic Bandgap Structures Based on Ferroelectric Films", IEEE, 2003, pp. 879-882.

Kuylenstierna, et al., "Tunable Electromagnetic Bandgap Performance of Coplanar Waveguides Periodically Loaded by Ferroelectric Varactors", Microwave and Optical Technology Letters, vol. 39, No. 2, Oct. 20, 2003, pp. 81-86.

Kuylenstierna, et al., Tuneable Electromagnetic Bandgap Structures Based on Ba0.25Sr0.75Ti03 Parallel-Plate Varactors on Silicon Coplanar Waveguides, 33rd European Microwave Conference, Munich 2003, pp. 1111-1114.

Ahamed, et al., "Design of a Si MMIC Compatible Ferroelectric Varactor Shunt Switch for Microwave Applications", IEEE Ultrasonics Ferroelectrics and Frequency Control Symposium, Montreal, Canada, Aug. 2004, pp. 1-4.

Liu, et al., "BaSrTiO3 Interdigitated Capacitors for Distributed Phase Shifter Applications", IEEE Microwave Guided Wave Letters, vol. 10, No. 11, Nov. 2000, pp. 448-450.

York, et al., "Synthesis and Characterization of (BaxSr1-x)Ti1+y03+z Thin Films and Integration Into Microwave Varactors and Phase Shifters", presented at ISIF 2000 Conference, Aachen, Germany, Mar. 2000 and to appear in Journal of Integrated Ferroelectrics.

York, et al., "Microwave Integrated Circuits Using Thin-Film BST", Proc. 12th IEEE Intl. Applications of Ferrelectrics Sym p. 1, pp. 195-200, 2001.

Brown, et al., "A Varactor Tuned RF Filter", Submitted for Review as a short-paper to the IEEE Trans., on MTT, Oct. 20, 1999, pp. 1-4.

Tombak, et al., "Voltage-Controlled RF Filters Employing Thin-Film Barium-Strontium-Titante Tunable Capacitors", IEEE Transactions on Microwave Theory and Techniques, vol. 51, No. 2, Feb. 2003, pp. 462-467.

Jin, et al., "Microwave Characterization of Thin Film BST Material Using a Simple Measurement Technique", IEEE MTT-S CDROM (IF-WE-14), 2002, pp. 1201-1204.

Yoon, et al., "A Reduced Intermodulation Distortion Tunable Ferroelectric Capacitor—Architecture and Demonstration", accepted in IEEE Trans. Microwave Theory Tech. Dec. 2003, pp. 2568-2576.

Fardin, et al., "Barium Strontium Titanate Thin Film Varactors on R-Plane Sapphire", Proceedings of Asia-Pacific Microwave Conference, 2006 IEICE, pp. 1-4, USA.

Mueller, et al., "Tunable Dielectric Materials and Devices for Broadband Wireless Communications", Ferroelectric and Acoustic Devices, D. Taylor and M. Francombe (eds.), Academic Press, 2000.

Tombak, et al., "Tunable Barium Strontium Titanate Thin Film Capacitors for RF and Microwave Applications", IEEE Microwave and Wireless Comp. Lett. 12, pp. 3-5, Jan. 2002.

Vorobiev, et al., "Silicon Substrate Integrated High Q Factor Parallel Plate Ferroelectric Varactors for Microwave/Millimeterwave Applications", Applied Physics Letters 83(15), pp. 3144-3146, 2003.

Subramanyam, et al., A Si MMIC Compatible Ferroelectric Varactor Shunt Switch for Microwave Applications, IEEE Microwave and Wireless Component Letters 15, pp. 749-751, Nov. 2005.

Pazik, et al., "Microwave drive hydrothermal synthesis of Ba1-xSrxTi03 nanoparticles", Materials Research Bulletin, Elsevier, Kidlington, GB, vol. 42 No. 7, Apr. 29, 2007, pp. 1188-1194.

Singh, et al., "Influence of crystallization on the spectral features of nano-sized ferroelectric barium strontium titanate (Ba0.7Sr0.3Tio3) thin films", Physica B. Condensed Matter, Amsterdam, NL, vol. 403, No. 17, Aug. 1, 2008, pp. 2678-2683.

4. Kozyrev A et al: Ferroelectric filims: nonlinear properties and applications in microwave devices, Microwave Symposium Digest, 1998 IEEE MTT-S International Baltimore, MD, USA Jun. 7-12, 1998, pp. 985-988, ISBNA: 0-7803-4471-5.

Gevorgian et al., "Electrically Controlled HTSC-Ferroelectric Coplanar Waveguide", IEE Proceedings: Microwaves, Antennas and Propagation, GB, IEE, Stevenage, Herts, vol. 141, No. 6, Part H, Dec. 1, 1994, pp. 501-503, XP000484786, issn: 1350-2417.

Galt et al., "Ferroelectric thin film characterization using superconducting microstrip resonators", Proceedings of the 1994 Applied Sueprconductivity Conference. Part 3 (of 3), Boston, MA, US Oct. 16-21, 1994, vol. 5, No. 2 part 3, Oct. 16, 1994, pp. 2575-2578, XP002206840 IEEE Trans Appl Supercond; IEEE.

Vendik et al., "1 GHz tunable resonator on bulk single crystal SrT103plated with YBa2Cu307 films", Electronics letters, IEE Stevenage, GB, Apr. 13, 1995, pp. 654-656, XP006002685, ISSN: 0013-4194.

Gevorgian et al., "HTS/Ferroelectric Devices for Microwave Applications", 1996 Applied Superconductivity Conference Pittsburgh, PA, USA, Aug. 25-30, 1996, vol. 7, No. 2, pt.3, pp. 2458-2461, XP002206841.

De Flaviis, F. et al., "Combined Mechanical and Electrical Analysis of a Microelectromechanical Switch for RF Applications," Proceedings of IEEE 29th European Microwave Conference, Oct. 1999, vol. 3, pp. 247-250.

* cited by examiner

US 9,000,866 B2

VARACTOR SHUNT SWITCHES WITH PARALLEL CAPACITOR ARCHITECTURE

BACKGROUND

The present disclosure generally relates to thin film varactor device structures and, in particular, to nanostructured dielectric thin-film varactors having a parallel capacitor architecture.

High K tunable, microwave dielectrics such as barium strontium titanate ($Ba_xSr_{(1-x)}TiO_3$), or BST, are gaining acceptance in microwave integrated circuits due to a large need for tunable/reconfigurable circuits. Semiconductor varactor diodes and PIN diodes can have relatively large Q below 10 GHz, but the Q can drop down drastically above 10 GHz making them less attractive for applications above 10 GHz. Radio-frequency (RF) microelectromechanical system (MEMS) switches can offer high Q at microwave and millimeterwave frequencies, but can be complex in nature, and the slow speed of switching can be undesirable for many applications. Ferroelectric varactors can be characterized by fast switching speed, ease of integration with silicon (Si) monolithic microwave integrated circuits (MMICs), and can have reasonable Q at microwave and millimeter-wave frequencies.

Ongoing needs remain for an improving RF performance over a broad frequency range that allows for larger signal isolation at lower frequencies.

SUMMARY

According to some embodiments, a parallel capacitor varactor shunt switch (VSS) device may include a shunt layer, a signal layer, and a tunable thin film dielectric layer that is interposed between the shunt layer and the signal layer. The tunable thin film dielectric layer electrically isolates the shunt layer from the signal layer. The shunt layer includes a first shunt-layer ground line, a second shunt-layer ground line parallel to the first shunt-layer ground line, and a plurality of parallel shunt lines. Each of the parallel shunt lines from the plurality of parallel shunt lines electrically connects the two ground lines. The coplanar waveguide (CPW) layer includes a CPW signal transmission line interposed between two ground lines. The plurality of shunt lines in the shunt layer are not in parallel to the CPW signal transmission line in the signal layer. A plurality of varactor areas equal in number to the plurality of parallel shunt lines are defined in the CPW signal transmission line, each varactor area corresponding to an overlap of the CPW signal transmission line with a respective shunt line and each respective parallel shunt line and its corresponding varactor area defines a capacitor.

Accordingly, it is a feature of some embodiments of the present disclosure to improve the tunability and RF performance of a nanostructured BST thin film varactor by increasing the number of parallel capacitors through increasing the number of shunt lines in the VSS device. Other features of the embodiments of the present disclosure will be apparent in light of the description provided herein.

BRIEF DESCRIPTION OF THE DRAWINGS

The following detailed description of specific embodiments of the present disclosure can be best understood when read in conjunction with the following drawings, where like structure is indicated with like reference numerals and in which.

DETAILED DESCRIPTION

In the following detailed description of the embodiments, reference is made to the accompanying drawings that form a part hereof, and in which are shown by way of illustration, and not by way of limitation, specific embodiments in which the disclosure may be practiced. It is to be understood that other embodiments may be utilized and that logical, mechanical and electrical changes may be made without departing from the spirit and scope of the present disclosure.

Figure 1:
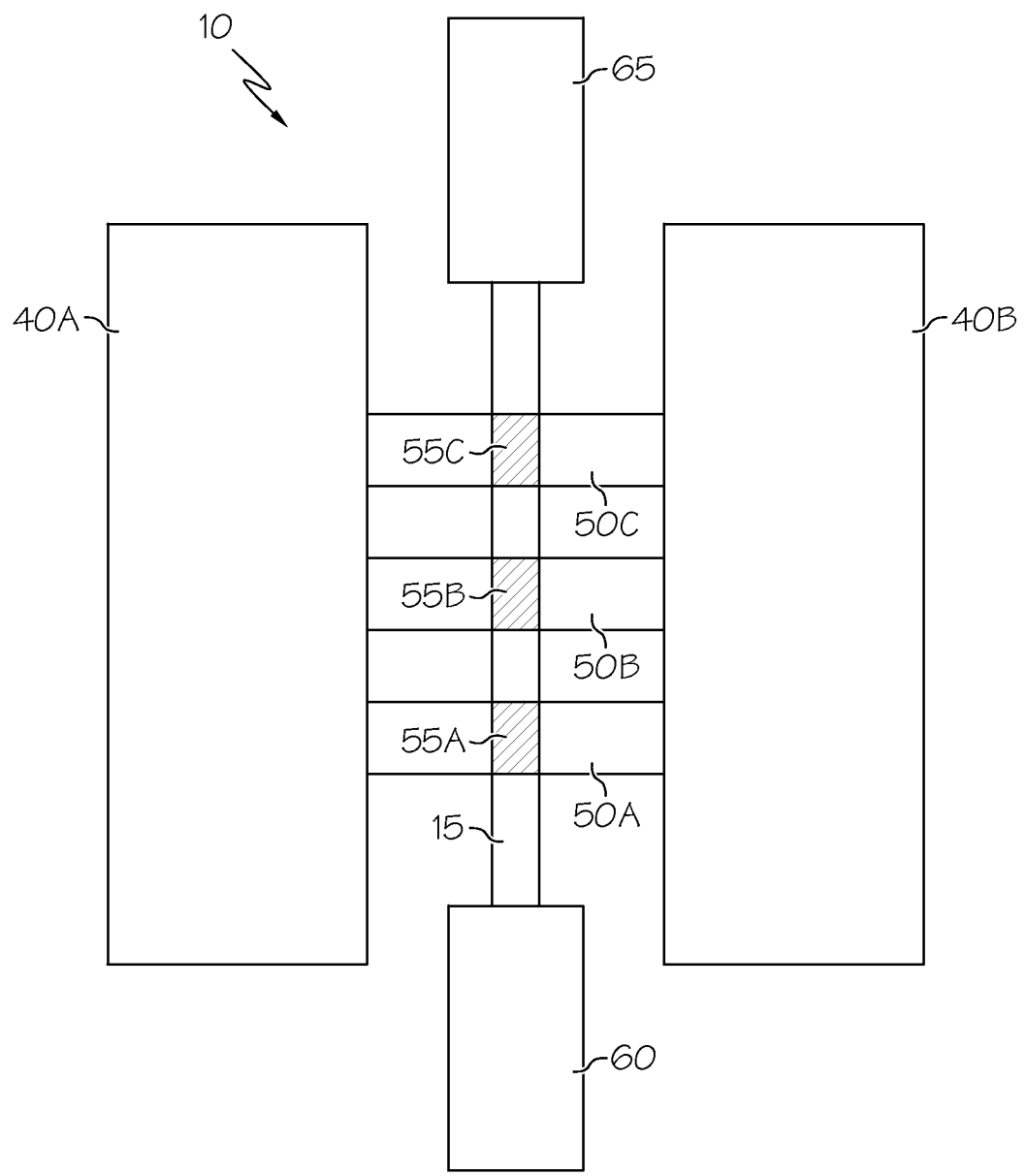
FIG. 1 is a sectional-view of a varactor shunt switch device having a plurality of shunt lines, according to an embodiment of the present disclosure.
Figure 2:
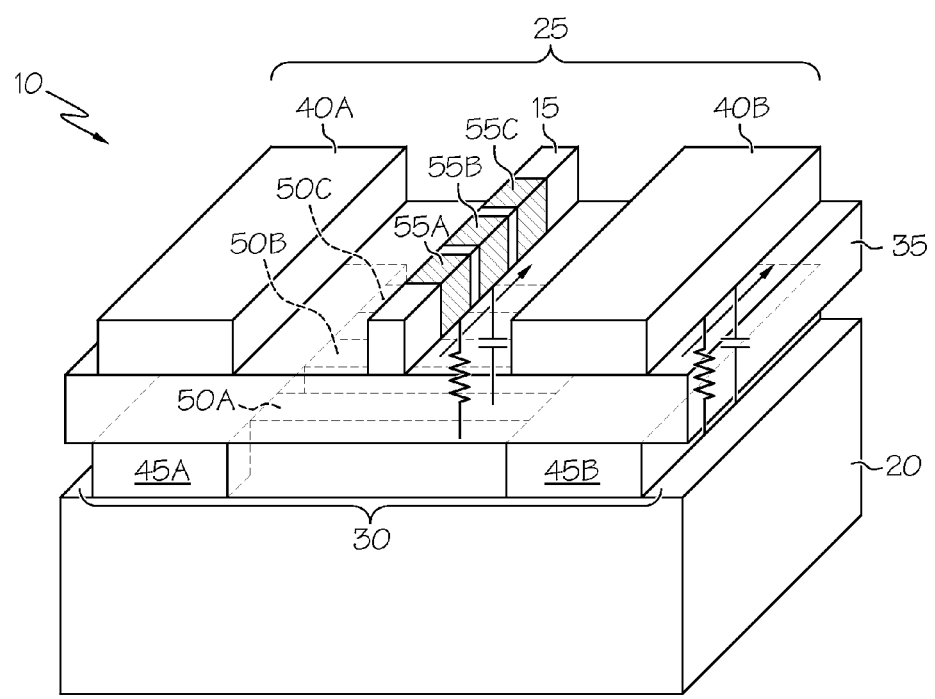
FIG. 2 is a three-dimensional view of a varactor shunt switch device according to an embodiment of the present disclosure.

Referring to the exemplary embodiment of FIGS. 1 and 2, a parallel capacitor varactor shunt switch (VSS) device 10 may comprise a shunt layer 30, a signal layer 25, a substrate 20, and a tunable dielectric thin film layer 35. The tunable dielectric thin film layer 35 is interposed between the shunt layer 30 and the signal layer 25 and electrically isolates the shunt layer 30 from the signal layer 25.

The shunt layer 30 may comprise a first shunt-layer ground line 45A and a second shunt-layer ground line 45B parallel to the first shunt-layer ground line 45A, and a plurality of parallel shunt lines 50A, 50B, 50C that each electrically connects the first shunt-layer ground line 45A and the second shunt-layer ground line 45B. In illustrative embodiments, the plurality of parallel shunt lines comprise greater than 1 shunt line, such as from 2 to 100, from 2 to 50, from 2 to 25, from 2 to 10, from 2 to 8, from 2 to 6, from 3 to 6, or from 4 to 6 parallel shunt lines, for example. Therefore, it should be understood that though the embodiments of FIGS. 1 and 2 include only three parallel shunt lines 50A, 50B, 50C, this is intended for illustrative purposes only and that the shunt layer 30 need only contain greater than one shunt line.

The coplanar waveguide (CPW) layer 25 may comprise a first CPW ground line 40A, a second CPW ground line 40B parallel to the first CPW ground line 40A, and a CPW signal transmission line 15 interposed between the first CPW ground line 40A and the second CPW ground line 40B. The plurality of parallel shunt lines 50A, 50B, 50C in the shunt layer 30 are not parallel to the CPW signal transmission line 15 in the signal layer 25. In preferred embodiments each individual shunt line of the plurality of parallel shunt lines 50A, 50B, 50C are skew to the CPW signal transmission line 15 and run in a direction perpendicular to the direction to the CPW signal transmission line 15.

A plurality of varactor areas 55A, 55B, 55C, equal in number to the plurality of parallel shunt lines 50A, 50B, 50C, are defined in the CPW signal transmission line 15. Each varactor area 55A, 55B, 55C corresponds to an overlap of the CPW signal transmission line 15 with a respective parallel shunt line 50A, 50B, 50C and each respective shunt line (for example 50A) and its corresponding varactor area (55A) defines a capacitor. Each varactor area 55A, 55B, 55C is the area affected by a capacitance between the CPW signal transmission line 15 and each of the parallel shunt lines 50A, 50B, 50C. The effective capacitance of the VSS device 10 includes the sum of the capacitance from each varactor area (e.g., the three varactor areas 55A, 55B, 55C in the embodiment of FIGS. 1 and 2), and also includes the capacitance between the two CPW ground lines 40A, 40B and the two shunt-layer ground lines 45A, 45B.

The large capacitance of the varactor areas 55A, 55B, 55C at zero bias may shunt an input signal to ground, thus isolating the output port of the CPW signal transmission line 15 and resulting in an OFF state of the VSS device 10. When a DC bias voltage is applied to the VSS device 10, capacitance between the CPW signal transmission line 15 and the varactor areas 55A, 55B, 55C may be reduced to a minimum, allowing the transmission of a larger portion of the input signal from an input port 60 of the CPW signal transmission line 15 to the output port 65 of the CPW signal transmission line 15, thus resulting in an ON state of the VSS device 10.

In one exemplary embodiment, the substrate 20 may be a high resistivity silicon substrate. The thickness of the high resistivity silicon substrate may be from about 100 μm to about 1000 μm, for example about 500 μm. The dimensions of the VSS device 10 may be scaled to fit an appropriate application. In an exemplary embodiment, the VSS device 10 may have outer dimensions such as approximately 450 μm×500 μm. In another illustrative embodiment, to obtain a characteristic impedance of about 50Ω at zero-bias, the CPW signal transmission line 15 width may be about 50 μm. In the same embodiment, the two CPW ground lines 40A, 40B may have widths of about 150 μm, and the CPW signal transmission line 15 may be separated from the two CPW ground lines 40A, 40B by about 50 μm.

In another exemplary embodiment, the tunable dielectric thin film layer 35 may be a nanostructured barium strontium titanate (BST) dielectric thin film. Though the BST have any suitable ratio of barium to strontium that provides a high level of tunability, in one non-limiting preferred embodiment, the BST may be $Ba_{0.6}Sr_{0.4}TiO_3$, for example. As used herein, the term "nanostructured" refers to a thin film made of a material having an average grain size of less than 100 nm, preferably less than 75 nm, for example from about 30 nm to about 75 nm. Thus, in one embodiment, the tunable dielectric thin film layer 35 may be a nanostructured BST dielectric thin film may have an average grain size less than 60 nm. In yet another exemplary embodiment, the nanostructured BST dielectric thin film may have an average grain size of about 30 nm to about 50 nm.

Referring to FIG. 1, a top-view of the VSS device 10 shows the first CPW ground line 40A and the second CPW ground line 40B, the CPW signal transmission line 15 and the plurality of parallel shunt lines 50A, 50B, 50C. The overlap area of the CPW signal transmission line 15 and plurality of parallel shunt lines 50A, 50B, 50C define the plurality of varactor areas 55A, 55B, 55C. In some embodiment, an input port 60 and an output port 65 may be attached to the CPW signal transmission line 15 for connecting other components (not shown) or external circuitry that transmits an input signal through the VSS device 10.

The perspective view of FIG. 2 further illustrates the layers of one embodiment of the VSS device 10. In this embodiment, the VSS device 10 is provided on a substrate 20. To form the VSS device 10, the shunt layer 30 may be deposited on the substrate 20, the tunable dielectric thin film layer 35 may be deposited on the shunt layer 30, and the signal layer 25 may be deposited on the tunable dielectric thin film layer 35. The CPW ground lines 40A, 40B are not parallel to the shunt-layer ground lines 45A, 45B. In preferred embodiments, the CPW ground lines 40A, 40B run in a direction that is perpendicular to the direction of the shunt-layer ground lines 45A, 45B. The overlap of the CPW signal transmission line 15 and the plurality of parallel shunt lines 50A, 50B, 50C results in the varactor areas 55A, 55B, 55C, from which it should be apparent that the number of varactor areas (i.e., three) is equal to the number of parallel shunt lines (i.e., three). The electrical symbols of capacitance and resistance in FIG. 2 indicate areas where the total effective capacitance, consistent with the equivalent circuit diagram of FIG. 3.

In one exemplary embodiment, the shunt layer 30 may comprise a metal stack. Standard positive photoresist lift-off photolithography can be used to form the metal stack. In an exemplary process for forming the metal stack, a Ti adhesion layer (e.g., 20 nm thick) may be deposited on the substrate 20, followed by deposition of gold (e.g., 800 nm thick) and platinum (e.g., 55 nm thick) to form the shunt layer 30. Any suitable metal-deposition system may be used such as, for example, an electron-beam evaporation system. In an alternative embodiment, lift-off photolithography may be used to deposit the shunt layer 30. After the shunt layer 30 has been formed, the tunable dielectric thin film layer 35 may be deposited over the entire surface of the shunt layer 30 by a suitable deposition method for forming dielectric films, particularly nanostructured dielectric films, such as pulsed-laser deposition, for example. In one preferred embodiment, the tunable dielectric thin film layer 35 may be a nanostructured $Ba_{0.6}Sr_{0.4}TiO_3$ dielectric thin-film. In additional embodiments, the nanostructured BST dielectric thin film may be deposited by sputtering, chemical vapor deposition, sol-gel method, or by any other suitable deposition method.

The BST dielectric thin film can be processed at oxygen partial pressure below about 150 mTorr in a large area deposition system (for example, using a Neocera Pioneer system capable of deposition on 4-inch diameter wafers) which may result in an average grain-size of the nanostructured BST dielectric thin film of approximately 30 nm to approximately 100 nm. The nanostructured BST dielectric thin-films may be fabricated by any suitable method known in the art such as, for example, RF sputtering and metal organic chemical vapor deposition (MOCVD). After the nanostructured BST dielectric thin film deposition, the signal layer 25 may be defined and processed using a lift-off technique to complete the VSS device 10 fabrication. The signal layer 25 may be defined by e-beam deposition or sputtering, for example, or by any other suitable method. The signal layer 25 may also comprise a metal stack.

Figure 3:
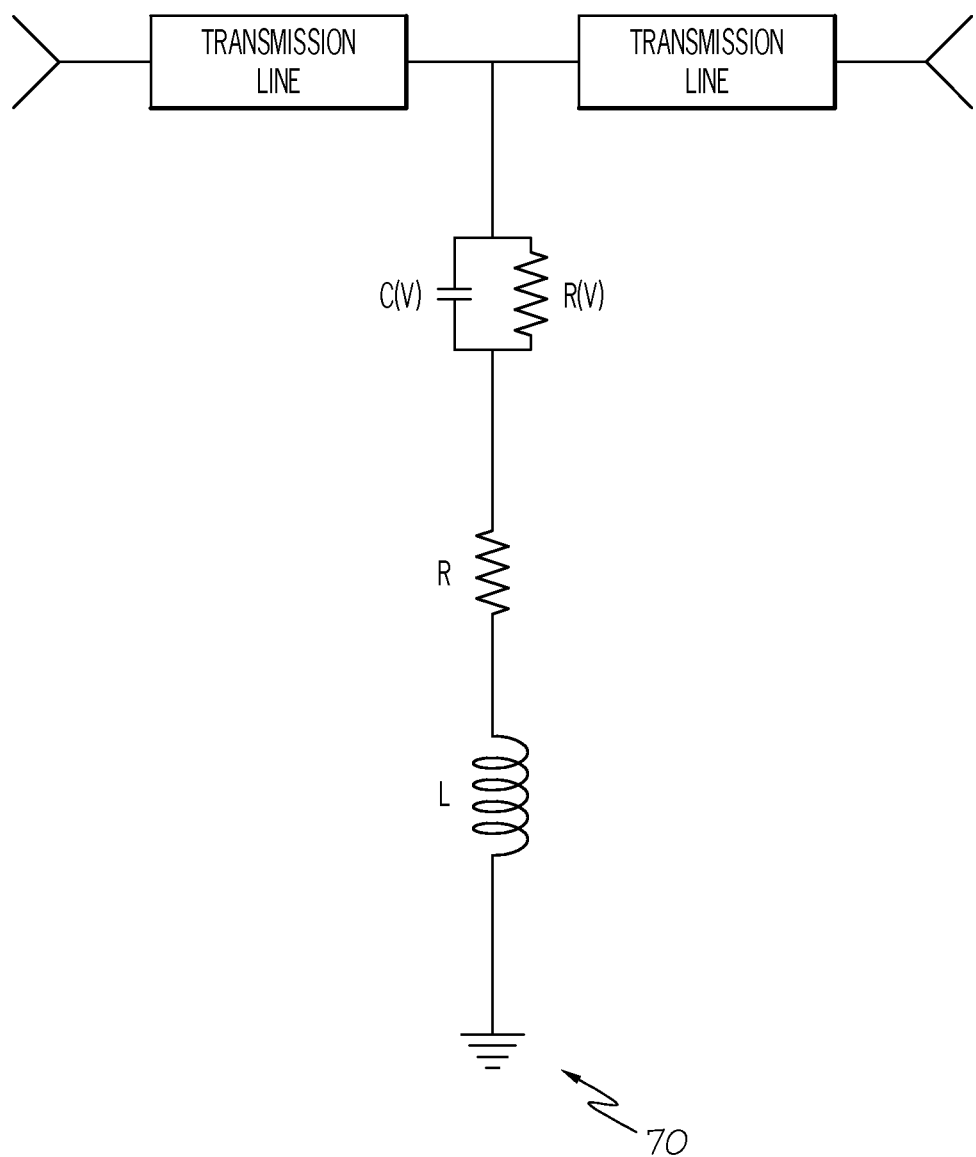
FIG. 3 is an equivalent circuit diagram of a varactor shunt switch device according to an embodiment of the present disclosure.

FIG. 3 shows an electrical model for the VSS device 10. With reference to FIG. 2, the VSS device 10 can be precisely modeled upon knowing several device parameters, specifically: (i) the varactor area 55; (ii) CPW signal transmission line 15 parameters, such as the width of the CPW signal transmission line 15, spacing between the CPW signal transmission line 15 and the two CPW ground lines 40A, 40B, and the length of the CPW signal transmission line 15 sections; (iii) parasitic inductance L and resistance R of the CPW signal transmission line 15 to ground 70 of the shunt layer 30; and (iv) the dielectric properties of the tunable dielectric thin film layer 35. The electrical properties of the varactor areas 55A, 55B, 55C such as capacitance C(V) and resistance R(V) may be included in the model. The parasitic inductance L and resistance R can be precisely calculated through the use of the electrical model.

Figure 4:
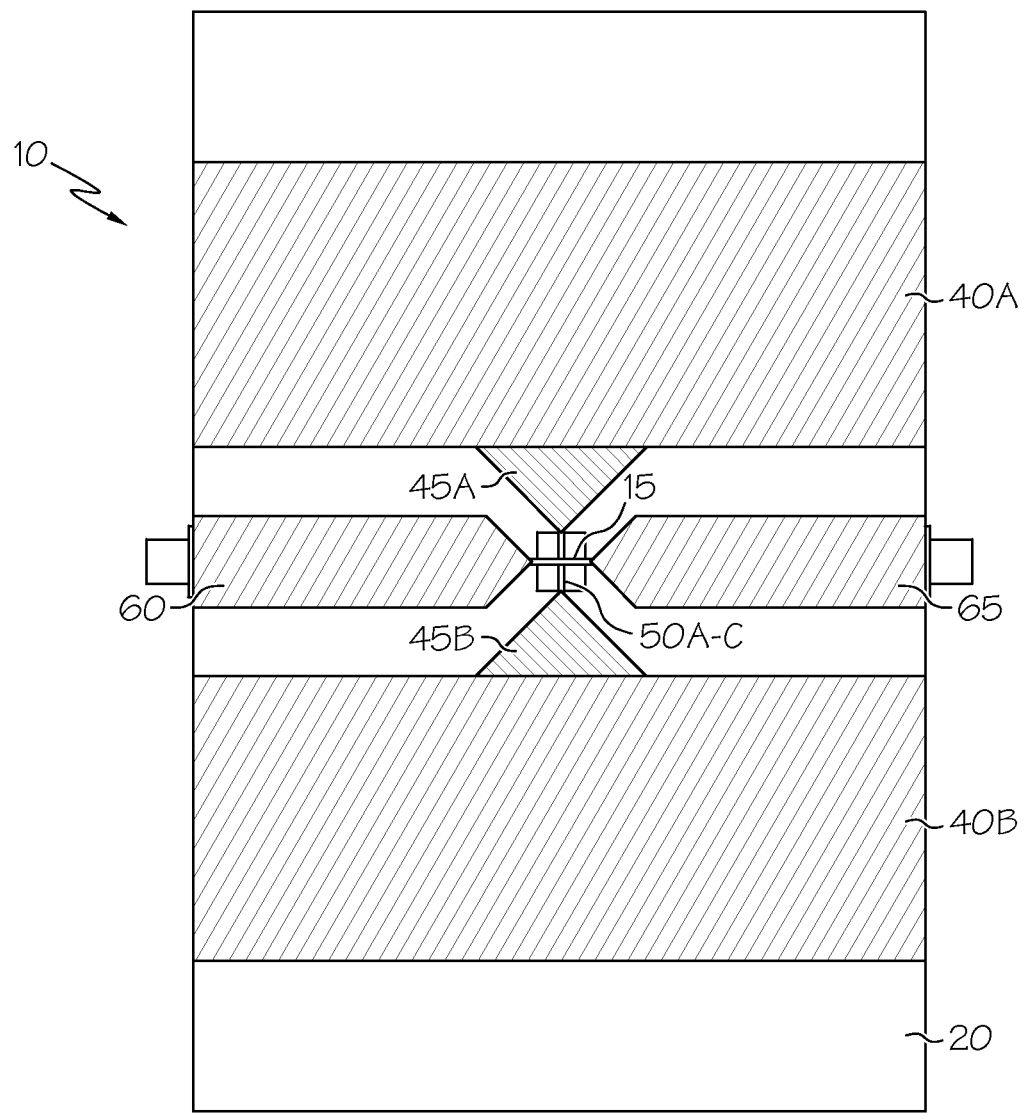
FIG. 4 is a top view of a four-capacitor varactor shunt switch device according to an embodiment of the present disclosure.

Referring to FIG. 4, in a top view of the VSS device 10 on the substrate 20, the two shunt-layer ground lines 45A, 45B lie directly below the two CPW ground lines 40A, 40B. The input port 60 and the output port 65 are larger areas to allow for the connection of the VSS device 10 to other components or external circuitry (not shown). The input port 60 and the output port 65 are connected to the VSS device 10 through opposite ends of the CPW signal transmission line 15.

The VSS device 10 exemplified in FIG. 2 may be tailored to have a desired specific frequency range of operation, because the unbiased state (OFF) resonance frequency determines the maximum isolation of the VSS device 10. Large-area varactors can result in high isolation, while at the same time increasing the insertion loss of the VSS device 10. The larger area of the varactor can also result in a large zero-bias capacitance of the VSS device 10. Ideally, the varactor capacitance can be reduced to the level of the line capacitance to obtain low insertion loss in the biased state (ON).

Compared to a VSS device having only a single shunt line, the VSS device 10 that contains a plurality of parallel shunt lines 50A, 50B, 50C may advantageously have a larger effective capacitance at zero-bias, resulting in high isolation for the VSS device 10. The high isolation characteristic of the VSS device 10 with a plurality of parallel shunt lines 50A, 50B, 50C instead of only one shunt line may be desirable even at low GHz frequencies, because a larger difference between the biased state (ON) and unbiased state (OFF) may be expected. Having multiple smaller capacitors in parallel, as accomplished by the varactor areas 55A, 55B, 55C, may improve the reliability of the VSS device 10 compared to a VSS having a single, large-area capacitor. Higher capacitance tunability is a characteristic of being able to apply higher bias voltage to the VSS device 10 compared to a VSS with the same equivalent capacitance. Although the shunt resistance R (FIG. 3) for the capacitors may effectively be lower, a positive aspect of this is the reduced parasitic inductance L (FIG. 3).

Experimental results have been obtained on several 5 µm×5 µm VSS devices with a varying number of parallel shunt lines 50A, 50b, 50C. The results are shown in FIG. 4. The characteristic swept frequency $S_{21}$, as used in FIGS. 5-7, is the ratio of transmitted power to input power.

Figure 5:
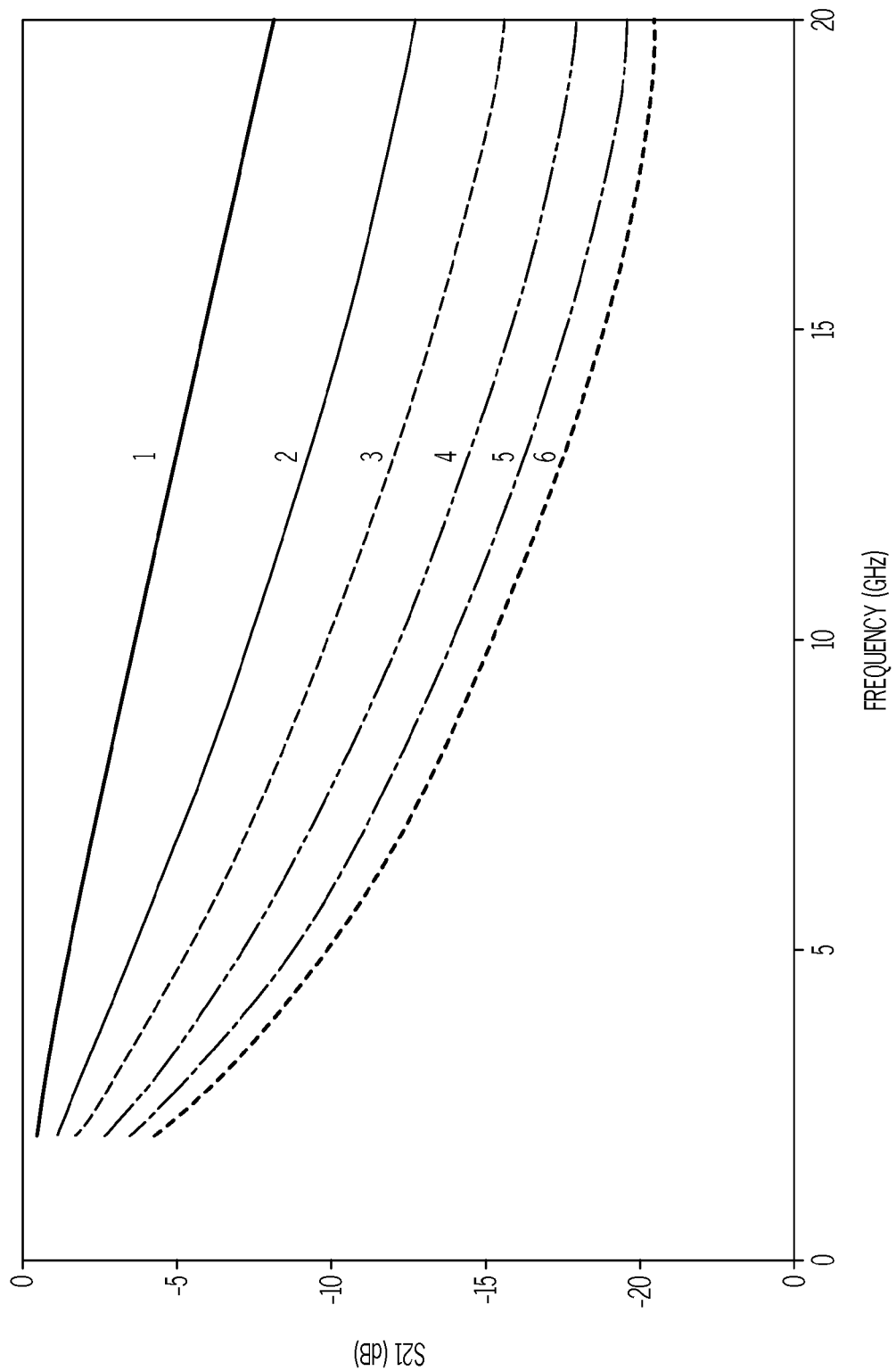
FIG. 5 graphs the isolation characteristics of the varactor shunt switch device according to an embodiment of the present disclosure.

The graph of FIG. 5 compares the isolation ($S_{21}$ at 0 V) of VSS devices having increasing numbers of parallel shunt lines. The number of parallel shunt lines (i.e., from 1 to 6) are shown on each plot in FIG. 5. Steady improvement in isolation has been demonstrated to occur with increasing the number of parallel shunt lines from 2 to 6, particularly as compared to a single shunt line. As the number of parallel shunt lines increases, the capacitance of the VSS devices also increases. FIG. 5 also depicts increased isolation at higher frequencies.

Figure 6:
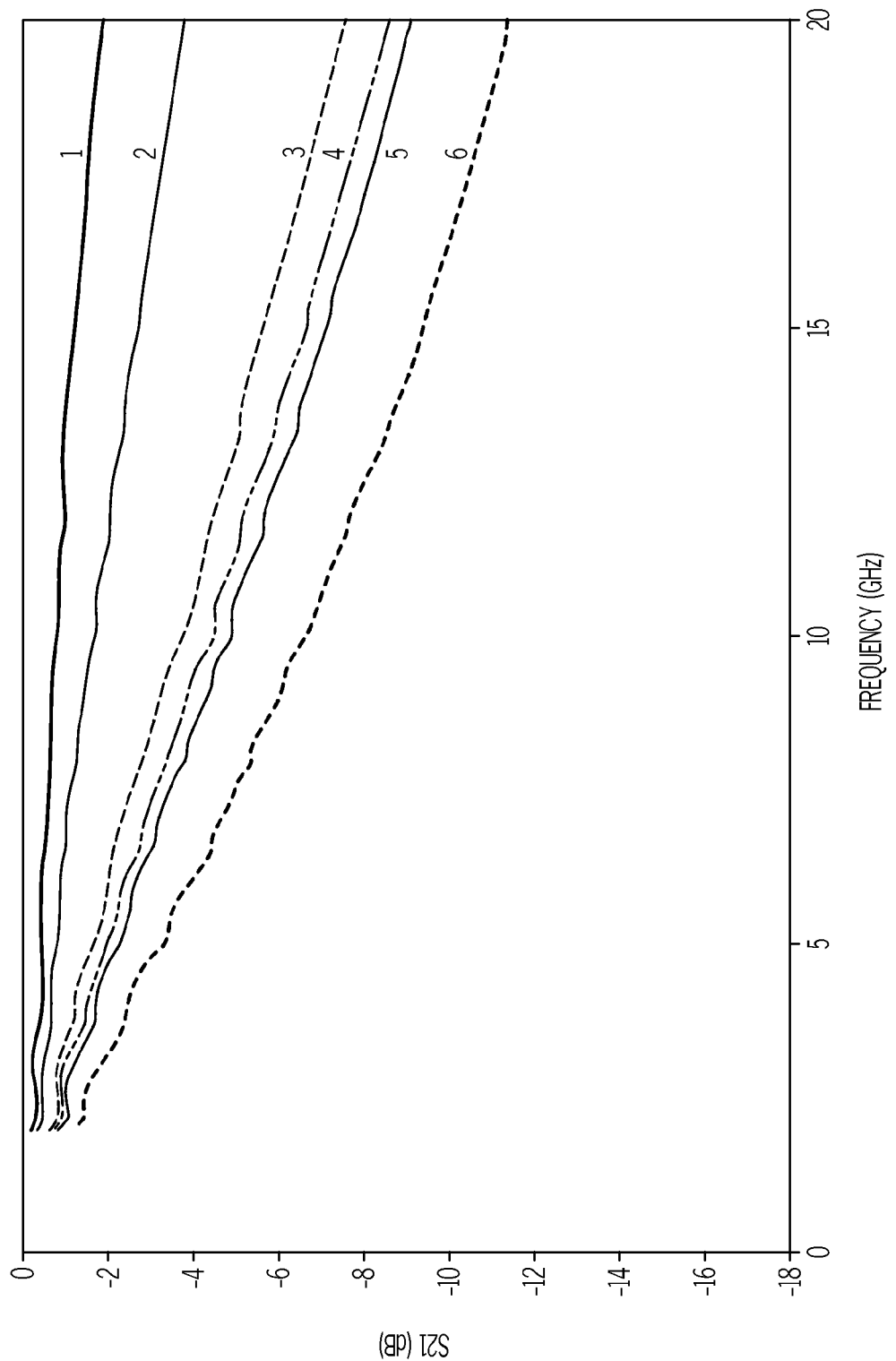
FIG. 6 graphs the insertion loss of the varactor shunt switch device according to an embodiment of the present disclosure.

The graph of FIG. 6 compares the insertion loss ($S_{21}$ at 0 V) of a single shunt line VSS and the plurality of parallel shunt lines 50A, 50B, 50C of the VSS device 10 of FIG. 4. In general, the graph is consistent with an increase of insertion loss with an increase in number of parallel shunt lines. The plots are shown at a 10 V DC bias voltage. The number of parallel shunt lines 50 are shown with each plot in FIG. 6.

Figure 7:
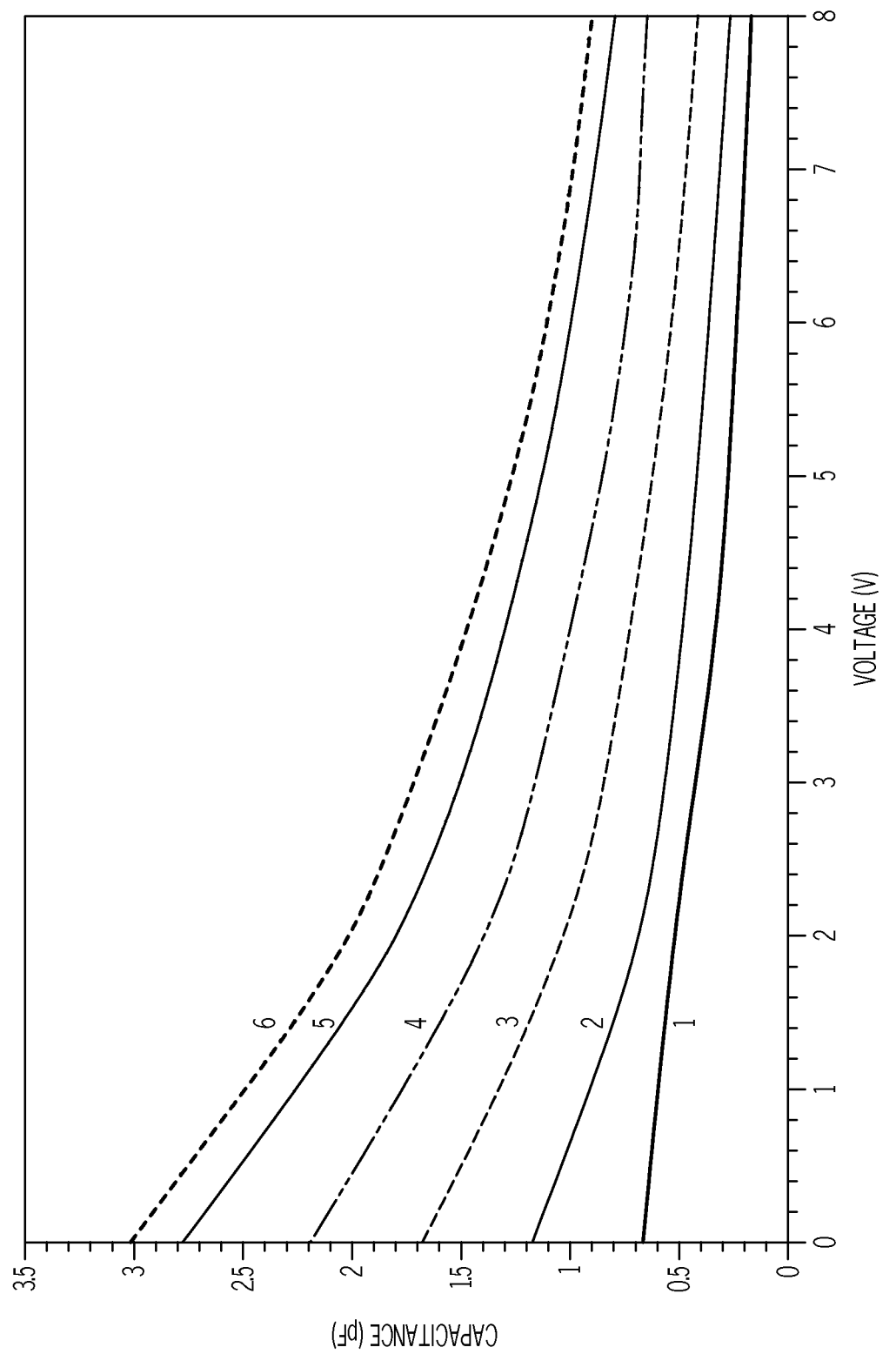
FIG. 7 graphs the capacitance vs. voltage characteristics for the varactor shunt switch device according to an embodiment of the present disclosure.

The graph of FIG. 7 compares the capacitance to the DC bias voltage of the VSS device 10 of FIG. 4. VSS devices having a plurality of parallel shunt lines are compared with a similar device having only a single shunt line. It is believed that the data of FIG. 7 indicate that large-capacitance varactors can indeed be realized without sacrificing the area of the devices. FIG. 7 also shows excellent tunability for the plurality of parallel shunt lines 50A, 50B, 50C, i.e. two or more parallel shunt lines, without the need for more real estate on a substrate, in general because the overall capacitance of the VSS device 10 is higher with multiple shunt lines, compared to a VSS with only a single thin shunt line. Some of the multi-shunt VSS devices were able to support DC bias voltages as high as 16 V. FIG. 7 illustrates that the multiple-shunt VSS device does not exhibit degradations in radio frequency (RF) performance over single-shunt line VSS devices.

The VSS device 10 of FIG. 4 may provide increased isolation at the expense of increased insertion loss. Although the insertion loss is higher for switching applications, the potential to implement large varactors using the VSS device 10 is attractive, as it does not sacrifice area. Also, the leakage currents in the VSS device 10 were comparable to the single shunt line VSS.

It is noted that terms like "preferably," "commonly," and "typically" are not utilized herein to limit the scope of the claimed disclosure or to imply that certain features are critical, essential, or even important to the structure or function of the claimed disclosure. Rather, these terms are merely intended to highlight alternative or additional features that may or may not be utilized in a particular embodiment of the present disclosure.

From the foregoing disclosure and its specific embodiments, it will be apparent that modifications and variations are possible without departing from the scope of the disclosure defined in the appended claims. It should be noted that, although some aspects of the present disclosure are identified herein as preferred or particularly advantageous, it is contemplated that the present disclosure is not meant to be limited to these preferred aspects of the disclosure.

It is noted that one or more of the following claims use the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A parallel-capacitor varactor shunt switch comprising:
   a shunt layer;
   a coplanar waveguide layer; and
   a tunable thin-film dielectric layer that is interposed between the shunt layer and the signal layer and electrically isolates the shunt layer from the signal layer,
   wherein:
   the shunt layer comprises a first shunt-layer ground line, a second shunt-layer ground line parallel to the first shunt-layer ground line, and a plurality of parallel shunt lines that each electrically connect the first shunt-layer ground line and the second shunt-layer ground line;
   the coplanar waveguide layer comprises a first coplanar waveguide ground line, a second coplanar waveguide ground line parallel to the first coplanar waveguide ground line, and a coplanar waveguide signal transmission line interposed between the first coplanar waveguide ground line and the second coplanar waveguide ground line;
   the plurality of parallel shunt lines in the shunt layer are not parallel to the coplanar waveguide signal transmission line in the signal layer,
   a plurality of varactor areas equal in number to the plurality of parallel shunt lines are defined in the coplanar waveguide signal transmission line, each varactor area corresponding to an overlap of the coplanar waveguide signal transmission line with a respective shunt line; and each respective shunt line and its corresponding varactor area defines a capacitor.

2. The parallel-capacitor varactor shunt switch of claim 1, wherein the plurality of parallel shunt lines comprises at least three parallel shunt lines.

3. The parallel-capacitor varactor shunt switch of claim 1, wherein the plurality of parallel shunt lines comprises at least four parallel shunt lines.

4. The parallel-capacitor varactor shunt switch of claim 1, wherein the plurality of parallel shunt lines comprises from 2 to 6 parallel shunt lines.

5. The parallel-capacitor varactor shunt switch of claim 1, further comprising an input port and an output port, the input port and the output port being connected to opposite ends of the coplanar waveguide signal transmission line.

6. The parallel-capacitor varactor shunt switch of claim 1, wherein the tunable thin-film dielectric layer is a nanostructured barium strontium titanate thin film dielectric layer.

7. The parallel-capacitor varactor shunt switch of claim 1, wherein the nanostructured barium strontium titanate thin film dielectric layer has an average grain size of from 30 nm to 100 nm.

8. The parallel-capacitor varactor shunt switch of claim 1, wherein the coplanar waveguide signal transmission line is parallel to both the first coplanar waveguide ground line and the second coplanar waveguide ground line.

9. The parallel-capacitor varactor shunt switch of claim 1, wherein the plurality of parallel shunt lines in the shunt layer are skew to the CPW signal transmission line and run in a direction perpendicular to the direction to the CPW signal transmission line.

10. The parallel-capacitor varactor shunt switch of claim 1 further comprising a substrate, herein the shunt layer is deposited on the substrate.

11. The parallel-capacitor varactor shunt switch of claim 7, wherein the shunt layer comprises a metal stack of gold and platinum deposited on the substrate.

12. The parallel-capacitor varactor shunt switch of claim 7, further comprising a titanium adhesion layer deposited on the substrate, the shunt layer being deposited on the titanium adhesion layer.

13. The parallel-capacitor varactor shunt switch of claim 1, wherein the tunable thin-film dielectric layer has an average grain size of from about 20 nm to about 30 nm.

\* \* \* \* \*

UNITED STATES PATENT AND TRADEMARK OFFICE
CERTIFICATE OF CORRECTION

Page 1 of 1

PATENT NO. : 9,000,866 B2
APPLICATION NO. : 13/533310
DATED : April 7, 2015
INVENTOR(S) : Guru Subramanyam It is certified that error appears in the above-identified patent and that said Letters Patent is hereby corrected as shown below:

In the Specification,

Column 1, line 3, insert the following:

--STATEMENT REGARDING FEDERALLY SPONSORED RESEARCH OR DEVELOPMENT

This invention was made with government support under FA8650-06-D-5401 awarded by United States Air Force. The government has certain rights in the invention.--

Signed and Sealed this
First Day of September, 2015

Michelle K. Lee
*Director of the United States Patent and Trademark Office*